(12) United States Patent
Samper et al.

(10) Patent No.: US 7,335,984 B2
(45) Date of Patent: Feb. 26, 2008

(54) MICROFLUIDICS CHIPS AND METHODS OF USING SAME

(75) Inventors: Victor Samper, Springdale (SG); Lin Cong, Singapore (SG); Hongmiao Ji, Singapore (SG)

(73) Assignees: Agency For Science, Technology and Research, Singapore (SG); National University of Singapore, Singapore (SG)

( * ) Notice: Subject to any disclaimer, the term of this patent is extended or adjusted under 35 U.S.C. 154(b) by 826 days.

(21) Appl. No.: 10/631,488

(22) Filed: Jul. 31, 2003

(65) Prior Publication Data

US 2005/0022888 A1 Feb. 3, 2005

(51) Int. Cl.
*H01L 23/34* (2006.01)
(52) U.S. Cl. .............................. 257/714; 257/E23.098; 257/E23.08; 257/E33.075
(58) Field of Classification Search ................. 257/714, 257/789, 678, 712–713, 715, 716, 721, 704, 257/E33.075, E31.131, E23.051, E23.08, 257/E23.081, E23.097, E23.098; 361/689, 361/698–699
See application file for complete search history.

(56) References Cited

U.S. PATENT DOCUMENTS

| 5,879,632 | A | 3/1999 | Demers |
| 5,901,037 | A * | 5/1999 | Hamilton et al. ........... 361/699 |
| 5,922,591 | A | 7/1999 | Anderson et al. |
| 5,962,081 | A | 10/1999 | Ohman et al. |
| 6,073,482 | A | 6/2000 | Moles |
| 6,136,212 | A | 10/2000 | Mastrangelo |
| 6,878,643 | B2 * | 4/2005 | Krulevitch et al. ......... 438/780 |

FOREIGN PATENT DOCUMENTS

| WO | WO9807069 | 2/1998 |
| WO | WO0117797 | 3/2001 |
| WO | WO03055790 | 7/2003 |

* cited by examiner

*Primary Examiner*—Hoai V Pham
*Assistant Examiner*—DiLinh Nguyen
(74) *Attorney, Agent, or Firm*—Winstead PC

(57) ABSTRACT

Microfluidics chips and methods of use are described, comprising a pair of wafers, at least one having a patterned surface, and two polymeric barrier films between the wafers conforming to the patterned surface. The polymeric barrier films allow the wafers of the inventive microfluidics chips to be reused without cleaning.

9 Claims, 2 Drawing Sheets

MICROFLUIDICS CHIPS AND METHODS OF USING SAME

CROSS-REFERENCE TO RELATED APPLICATIONS

This application is related to patent application Ser. No. 10/631,478, filed Jul. 31, 2003.

BACKGROUND INFORMATION

1. Technical Field

The invention is generally related to the field of micofluidics. More specifically, the invention relates to novel microfluidics chips and methods of using same which address the problem of contamination of patterned surfaces in such devices.

2. Background Art

Currently known microfluidics chips typically comprise two mating halves or wafers, each having patterned surfaces. The patterns are such that when the two wafers are placed adjacent each other, a microfluidics cavity or flow channel is formed between the wafers. The two wafers are bound together in a process referred to as wafer bonding. One or more fluids is forced through the microfluidics channel, for example a sample and a reagent. One problem with this arrangement is that in order to reuse this wafer bonded microfluidics chip device to analyze a new sample, the microfluidics channels must be thoroughly cleaned, which is difficult and time consuming. These problems can be understood by considering the example of handling a blood sample. In most respects it is undesirable that the blood, or any related biological product, contact the patterned surfaces of the wafers. If contamination occurs, the microfluidics chip patterned surfaces must be cleaned before the device can be used for a new sample.

U.S. Pat. No. 6,082,185 describes a compact fluid circuit card having a main body with internal sensing elements and with fluidic circuit components located on both its front and back surfaces. The cards are described as being made inexpensive enough to be disposable by forming its main body and all of its fluidic circuit components so that they are suitable for being integrally formed in one piece by injection molding from plastic, and by using thin strips of adhesively attached material for the main cover bodies, and valve membrane strip. The patent describes the use of heat shrinkable plastic as one suitable valve membrane material. While the patent does describe prevention of cross contamination between liquids in the card by using plastic valve membranes, there is no provision for preventing contamination of the actual fluidic circuit components.

Patent Cooperation Treaty International Publication No. WO 02/18827 A1, published Mar. 7, 2002, describes microfluidics valves which include a microconduit for carrying fluid therethrough and at least one microactuating mechanism for selectively deflecting at least a portion of a wall of the microconduit, thus occluding fluid flow through the microconduit. This publication describes a microfluidics valve that is opened or closed by heating and expanding a flexible material to open and close the microfluidics channels. The flexible material may be selected from materials including, but not limited to, "silicon rubber, natural rubber, polyurethane, PVC, polymers and any other similar flexible mechanism known to those of skill in the art." This document does not disclose or suggest protecting flow channels in microfluidics chips from contamination.

U.S. Pat. No. 6,443,179 describes a method for electromicrofluidics systems packaging. The patent describes "a new architecture" relying on two scales of packaging to bring fluid to the device scale (picoliters) from the macroscale (microliters). The larger package consists of a circuit board with embedded fluidic channels and standard fluidic connectors (referred to as a fluidic printed wiring board). The embedded channels connect to the smaller package, referred to as an electromicrofluidics dual-inline-package (EMDIP) that takes fluid to the microfluidics integrated circuit (MIC). The fluid connection is made to the back of the MIC through etched holes that take fluid to surface micromachined channels on the front of the MIC. While adhesive layers are used to bond different components together, the fluidic passageways are nonetheless exposed to the sample. Essentially the adhesive films function as gasket materials.

U.S. Pat. No. 6,068,751 describes a microfluidics delivery system that allows control of flow of a fluid through elongated capillaries that are enclosed along at least one surface by a layer of a malleable material. An electrically powered actuator included in the systems extends toward or retracts a blade from the layer of malleable material to either occlude or open capillaries. Reservoirs included in the pouch together with the capillaries supply fluids whose flow is controlled by movement of the blades. This patent does describe a microfluidics system in which an actuator portion of a valve does not become contaminated during system operation and in fact the actuator portion of the valves are reusable without cleaning. However, the microfluidics delivery systems of this particular patent require electromechanical valves to stop and start flows of fluids, with components that are irregularly shaped, and do not employ a vacuum for shaping of barrier films.

There is a need in the microfluidics art for microfluidics chips and methods of using same, which feature little or no raw sample contamination of microfluidics flow channels.

SUMMARY OF THE INVENTION

The microfluidics chips and methods of the present invention reduce or overcome many deficiencies of the prior art, and in particular allow components having patterned surfaces to be reused. As used herein "reused" and "reusable" mean that the components having patterned surfaces do not have to be cleaned prior to use with another sample.

A first aspect of the invention is a microfluidics chip comprising:
a) a first wafer having a patterned top surface;
b) a first polymeric barrier film in close conformity with the patterned top surface of the first wafer;
c) a second polymeric barrier film having some portions that are adjacent the first polymeric barrier film and some portions that are positioned away from the first polymeric film, forming a fluid flow channel between the first and second polymeric barrier films; and
d) a second wafer having a surface adjacent the second polymeric barrier film.

The microfluidics chips of the invention may have first and second wafer patterned surfaces comprising a feed reservoir; a laminar flow channel connected on one end to the feed reservoir; and a product reservoir connected to the feed reservoir via the laminar flow channel. The patterned surfaces can be any shape according to the intended application of the inventive microfluidics chips. The microfluidics chips of the invention may comprise electrically conducting features, heat-conducting elements, and the first and second polymeric barrier films may comprise polymers independently selected from the group consisting of thermoplastic polymers and elastic polymers, such as thermoplastic elastomers. Thermoplastic polymers may be selected from the group consisting of those whose backbones contain only carbon (carbon chain polymers), and whose backbones contain additional atoms such as oxygen, nitrogen, sulfur, or silicon (heterochain polymers). Those from the first class include polyolefins, such as polyethylene; acrylonitrile-butadiene-styrene homopolymers and interpolymers; diene polymers, such as polyisoprene and polychloroprene; polyvinyls such as polyvinyl chloride and polyvinyl acetate; acrylics, such as poly(methyl methacrylate) (PMMA); fluorocarbon polymers such as poly(tetrafluoroethylene) (PTFE) (with suitable pretreatment of substrates). Polymers useful as polymeric barrier films from the heteroatom class include polyesters, including saturated and unsaturated polyesters; polyethers; polysaccharides; polyamides; polyimides; aldehyde condensation polymers; polymers based on isocyanate reactions; silicones; and mixtures thereof. Suitable unsaturated polyesters include branched alkyd resins and linear or long-branched resins for casting with styrene monomer. Suitable saturated polyesters include terephthalates, polycarbonates, and polylactones. Polycarbonates include saturated polyesters. The polymeric barrier films can have higher heat conductivity than the wafer material, allowing heat to be carried away from or delivered to the flow channels.

The top wafer may comprise a patterned bottom surface, and this patterned bottom surface may correspond substantially with a patterned top surface of the bottom wafer. For example, the top wafer may have a patterned bottom surface that mirrors the patterned top surface of the bottom wafer, or the patterned bottom surface of the top wafer may fit together in male/female relationship with the patterned top surface of the bottom wafer. In both configurations, the polymeric barrier films are positioned in between the wafers.

A second aspect of the invention is a method comprising the steps of:
a) overlaying a top surface of a first wafer with a first polymeric barrier film, the top surface comprising at least one laminar flow channel and a sample reservoir connected to the laminar flow channel;
b) applying vacuum to draw the first polymeric barrier film against the top surface of the first wafer;
c) loading a fluid sample onto the first polymeric barrier film over the sample reservoir;
(d) overlaying a second polymeric barrier film over a second wafer;
e) applying vacuum to draw the second polymeric barrier film against the second wafer; and
f) contacting portions of the first and second polymeric barrier films, thereby forming an assembly having a fluid flow channel lined with the first and second polymeric barrier films.

A variation of this method comprises the steps of:
a) overlaying a top surface of a first wafer with a first polymeric barrier film, the top surface comprising at least one laminar flow channel and a sample reservoir connected to the laminar flow channel;
b) overlaying a second polymeric barrier film over a second wafer;
c) applying vacuum to draw the first polymeric barrier film against the top surface of the first wafer and to draw the second polymeric barrier film against the second wafer, thus forming a chamber;
d) contacting portions of the first and second polymeric barrier films to form an assembly having the at least one laminar flow channel and the sample reservoir lined with the first and second polymeric barrier films; and
e) loading a fluid sample into the lined sample reservoir.

Further aspects and advantages of the invention will become apparent by reviewing the description of embodiments that follows.

BRIEF DESCRIPTION OF THE DRAWINGS

For a more complete understanding of the present invention, and the advantages thereof, reference is now made to the following description taken in conjunction with the accompanying drawing, which is a representative illustration and not necessarily to scale, and in which.

DETAILED DESCRIPTION

Figure 1:
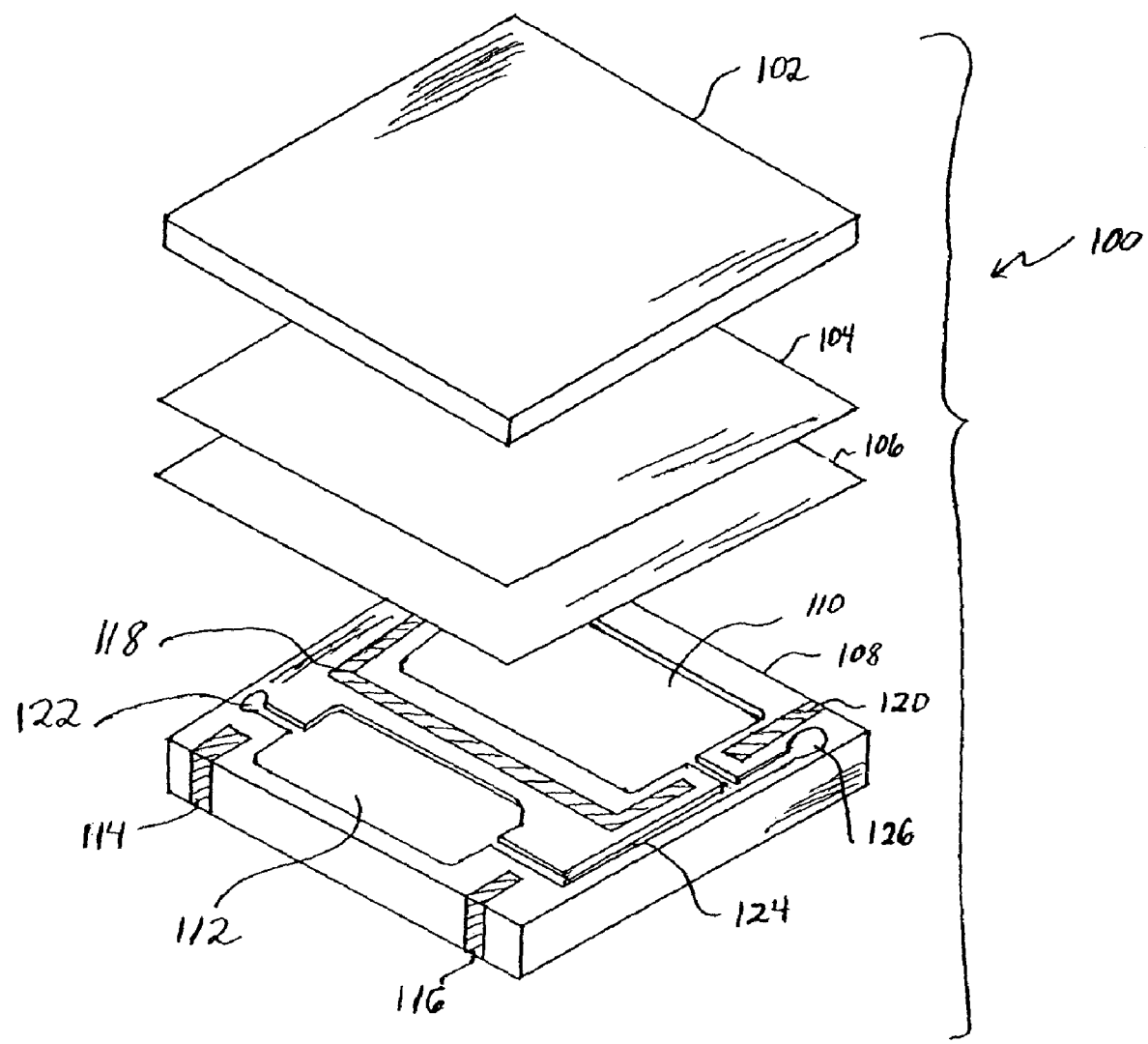
FIG. 1 is an exploded perspective view of a microfluidics chip in accordance with the present invention.

The microfluidics chips and methods of the present invention utilize thin polymeric barrier films over patterned parts. As used herein the term "patterned" includes, but is not limited to, machined parts and parts having patterns created by other methods, for example printing, embossing etching, and the like. The polymer polymeric barrier films are disposable, allowing the patterned parts to be reusable. In place of conventional wafer to wafer bonding to form microfluidics channels and chambers, the top and bottom wafers may be mechanically clamped together during operation of the chip. Between the two wafers, two thin polymer barrier films are inserted. Vacuum may be used to draw the polymeric barrier films against the patterned wafers. The two wafers are mechanically clamped together to form an assembly and is ready to use. After use of the lined microfluidics chip, the polymeric barrier films can be disposed of and the patterned parts can be reused. Since the two wafers are not bonded together during the fabrication process, there is direct access to the interior of the chamber prior to clamping the two wafers together, allowing direct placement of the sample inside the device. The conformity of the polymeric barrier films or linings can be improved by applying heat during the stage when the polymeric barrier film is forming the lining of the patterned part. Valves can also be formed by taking advantage of the elastic and/or plastic properties of the polymeric barrier films.

Embodiments of the invention may utilize a thin polymer barrier film comprised of polymeric materials such as, but not restricted to polyurethane, epoxy and polycarbonate. The polymeric barrier films can undergo both elastic and/or plastic deformation. The polymeric barrier film conformity to patterned surfaces is achieved through a differential pressure across the film's two surfaces. This may be achieved by reducing pressure on the side of the film facing the patterned surface (opposite to the surface in contact with the fluids). The reduced pressure may be achieved through small holes or pores in the wafers, referred to as vacuum channels in reference to the figures. Many holes or pores can be connected together to reduce the number of external low-pressure connections. The hole or pore size is small enough to have minimal polymeric barrier film deformation into the holes. Typically, the polymeric barrier film deformation over the low-pressure connection holes or pores is less than 10% of its overall conformity into the substrate channels. The polymeric barrier film is chosen for its compatibility with the chosen application. For example, in the case of nucleic acid sample preparation and polymerase chain reaction (PCR) amplification one suitable polymeric barrier film material is polyurethane. The film thickness may range from about 5 micrometers to about 100 micrometers. The width of channels patterned on the wafers may range from about 10 micrometers to about 5 millimeters wide. The depth of the channels may range from about 10 micrometers to about 1 millimeter.

The principles of the invention may be applied to a sample processing system. In the micromachining domain this includes microfabricated chips where the micromachined chip can be reused without cleaning by protecting the chip with a polymeric barrier film over the chip's micromachined surface. The polymeric barrier film conforms to the surface of the chip by applying a differential pressure across its surfaces, for example, applying low pressure (vacuum) to the side of the film adapted to contact the micromachined surface. The degree of polymeric barrier film conformity is determined by the size of the features, the film thickness, temperature, film material, the chip or substrate feature profiles, and the differential pressure applied. Polymeric barrier film properties can also be chosen to manage the thermal performance of the device. This is relevant to thermal reactors where thermal isolation or heat sinking properties are required.

Figure 2:
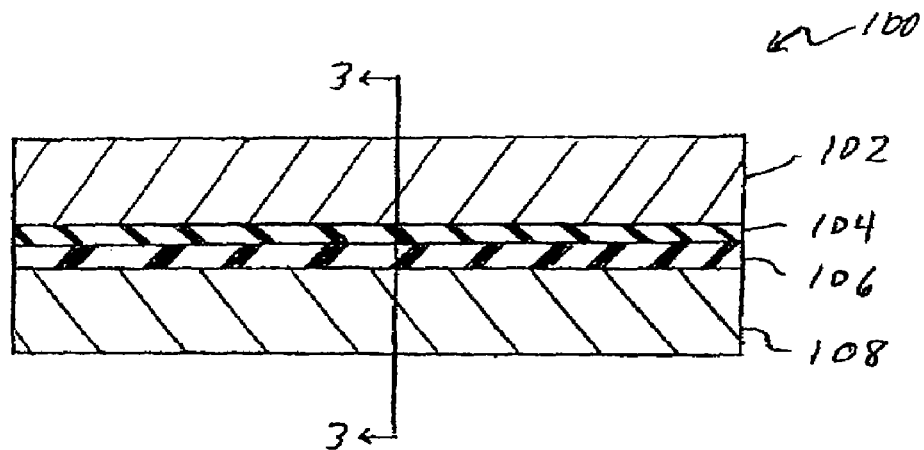
FIG. 2 is a side elevation view of the microfluidics chip of FIG. 1.
Figure 3:
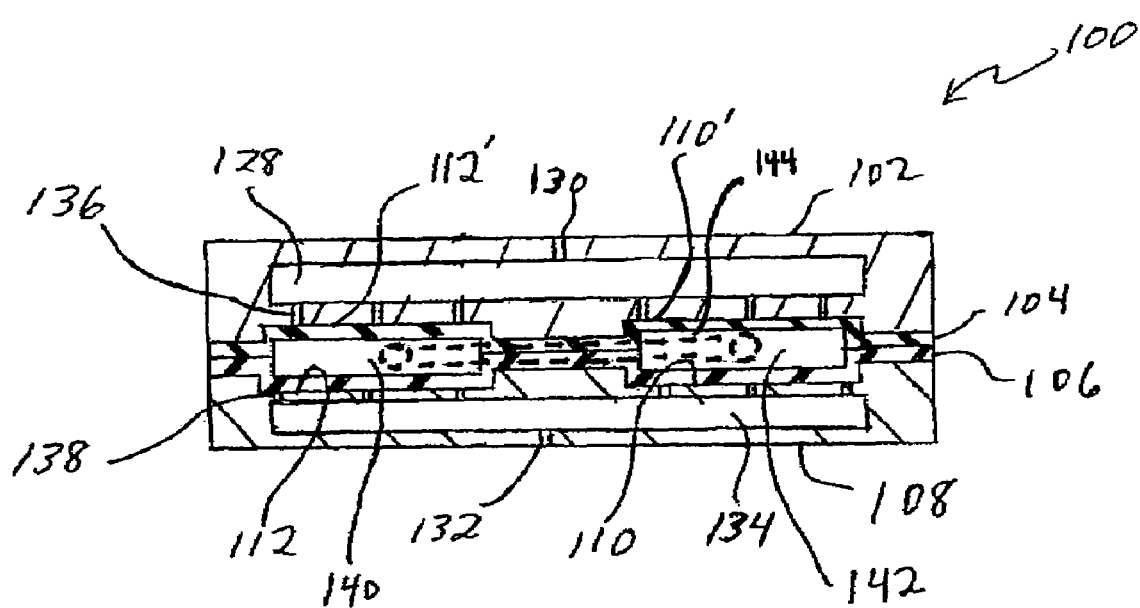
FIG. 3 is a cross sectional view of the microfluidics chip of FIGS. 1 and 2, taken along the line 3-3 of FIG. 2.

Referring now to the drawing figures, an apparatus embodiment of the invention is illustrated in FIGS. 1, 2 and 3. FIG. 1 is an exploded perspective view of a microfluidics chip 100 in accordance with the present invention. Polymeric barrier films 104 and 106 are adapted to be positioned between an upper component 102 and a substrate 108. Upper component 102 and bottom component 108 may each include a vacuum chamber (not illustrated in FIG. 1, but illustrated and discussed with reference to FIG. 3) for effecting a vacuum on polymeric barrier films 104 and 106, respectively. Polymeric barrier films 104 and 106 prevent the fluids from directly contacting micromachined surfaces of upper component 102 (if any) and substrate 108, respectively. Upper component 102 might include analytic means, for example optical observation means, such as means to measure refractive index, color, and/or thermal properties of the fluids. Substrate 108 includes patterned depressions 110, 112, 122, 126 and channel 124 in this exemplary embodiment. It should be understood that patterned surfaces other than those specifically described are within the invention. Also illustrated in FIG. 1 are elements 114, 116, 118, and 120, which may be electrically conductive and/or heat conductive. For example, elements 114 and 116 may be electrical connections, while elements 118 and 120 may be heat conducting elements designed to carry heat away from fluids traversing the chamber formed between films 104 and 106 through depressions 110, 112, and channel 124.

FIG. 2 illustrates a side elevation view of embodiment 100, illustrating how the polymeric barrier films 104 and 106 form a seal around the outer periphery of the microfluidics chip 100 after the assembly is formed.

FIG. 3 illustrates a cross-sectional view taken along the line "3-3" of FIG. 2. Illustrated in FIG. 3 are patterned depressions 110' and 112' in upper component 102, which substantially mirror patterned depressions 110 and 112 in substrate 108. Upper component would also include depressions corresponding to depressions 122, 124, and 126 of substrate 108, but are not illustrated in this particular cross section. In non-limiting embodiment 100, vacuum is applied via a vacuum pump or other vacuum producing means (not shown) to a vacuum chamber 128 through passages 130 and 136 to draw film 104 against depressions 110' and 112' of upper component 102. Similarly, vacuum is applied via a vacuum source to a vacuum chamber 134 through passages 132 and 138 to draw film 106 against substrate 108. Consequently, flow chambers 140 and 142 are formed between films 104 and 106 according to the patterns on the upper component and the substrate. For example, a sample may be placed in lined chamber 140 prior to assembly of microfluidics chip 100. By doing so, contamination of the patterned surfaces of the wafers is avoided since no sample can contact these surfaces. The embodiments of the invention prevent contamination of the microfluidics chip thus the chip is reusable. Note that polymeric barrier films 104 and 106 substantially conform to fluid flow channels 124 to form a fluid flow channel 144 between, or lined with, films 104 and 106. As used herein the term "passage" includes, but is not limited to, smooth bore through holes, tortuous paths, and the like. It should be emphasized that vacuum chambers 128 and 134 may be any shape rather than rectangular as depicted in FIG. 3, and vacuum passages 130, 132, 136, and 138 may have a variety of configurations, as long as the vacuum applied is able to draw the polymeric barrier films against the wafers.

In using the microfluidics chips of the invention, there are two basic scenarios. The first method comprises overlaying a top surface of a first wafer with a first polymeric barrier film, the top surface comprising at least one laminar flow channel and a sample reservoir connected to the laminar flow channel. The user then applies vacuum sufficient to draw the first polymeric barrier film against the top surface of the first wafer, and simultaneously or sequentially loads a fluid sample onto the first polymeric barrier film over the sample reservoir. The user then overlays a second polymeric barrier film over a second wafer, and applies vacuum sufficient to draw the second polymeric film against the second wafer. Finally, the user brings the two assemblies together so that portions of the first and second polymeric films that are not meant to be exposed to sample are adjacent and touching, thereby forming a sealed assembly having a fluid flow channel between and lined with the first and second polymeric barrier films. Typically, a clamp may be used to hold the assembly together with force sufficient to prevent leakage. When finished analyzing or otherwise processing the sample, the assembly is opened, and the polymeric barrier films discarded.

An alternate method of use comprises overlaying a top surface of a first wafer with a first polymeric barrier film, the top surface comprising at least one laminar flow channel and a sample reservoir connected to the laminar flow channel. The user then overlays a second polymeric barrier film over a surface of a second wafer, and simultaneously or sequentially applies sufficient vacuum to draw the first polymeric film against the top surface of the first wafer and to draw the second polymeric film against the surface of the second wafer. The user then contacts portions of the first and second polymeric barrier films to form a sealed assembly having the at least one laminar flow channel and the sample reservoir between and lined with the first and second polymeric barrier films. A sample is then loaded into the polymer-lined sample reservoir. As in the first method, a clamp may be used to hold the assembly together. When the user is finished analyzing or otherwise processing the sample, the assembly is opened, and the polymeric barrier films discarded.

Although the foregoing examples and description are intended to be representative of the invention, they are not intended to in any way limit the scope of the appended claims.

What is claimed is:

1. A microfluidics chip comprising:
   a) a first wafer having a patterned top surface;
   b) a first polymeric barrier film in close conformity with the patterned top surface of the first wafer;
   c) a second polymeric barrier film having some portions that are adjacent the first polymeric barrier film and some portions that are positioned away from the first polymeric film, forming a fluid flow channel between the first and second polymeric barrier films; and
   d) a second wafer having a surface adjacent the second polymeric barrier film.

2. The microfluidics chip of claim 1 wherein the first wafer patterned top surface comprises:
   a) a feed reservoir;
   b) a laminar fluid channel connected on one end to the feed reservoir; and
   c) a product reservoir connected to the feed reservoir via the laminar flow channel.

3. The microfluidics chip of claim 1 comprising electronically conducting features.

4. The microfluidics chip of claim 1 comprising heat conducting elements.

5. The microfluidics chip of claim 1 wherein the first and second polymeric barrier films each comprise polymers independently selected from the group consisting of thermoplastic polymers and elastomeric polymers.

6. The microfluidics chip of claim 5 wherein the polymer comprising each polymeric barrier film is a thermoplastic polymer.

7. The microfluidics chip of claim 1 wherein the polymer comprising each polymeric barrier film is an elastomer.

8. The microfluidics chip of claim 1 wherein the surface of the second wafer adjacent the second polymeric barrier film is a patterned surface.

9. The microfluidics chip of claim 8 wherein the patterned surface of the first wafer corresponds with the patterned surface of the second wafer.

* * * * *